(12) United States Patent
Yellin

(10) Patent No.: US 6,963,889 B1
(45) Date of Patent: Nov. 8, 2005

(54) WAVE DIGITAL FILTER WITH LOW POWER CONSUMPTION

(75) Inventor: Daniel Yellin, Raanana (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/511,737

(22) Filed: Feb. 24, 2000

(51) Int. Cl.[7] ............................................. G06F 17/10

(52) U.S. Cl. .................................................... 708/317

(58) Field of Search ................................ 708/317–318, 708/316

(56) References Cited

U.S. PATENT DOCUMENTS

| | | | |
|---|---|---|---|
| 4,982,355 A | | 1/1991 | Nishimura et al. |
| 5,197,020 A | * | 3/1993 | Schwartz ..................... 708/317 |
| 5,561,617 A | * | 10/1996 | Van der Wal ............... 708/316 |
| 6,065,032 A | * | 5/2000 | Nicol .......................... 708/628 |

OTHER PUBLICATIONS

Fettweis, Alfred; "Wave Digital Filter: Theory and Practice"; Proceedings of the IEEE; vol. 74; No. 2; pp. 270-327; Feb. 1986.
Manshanden et al.; "Design of Wave Digital Filters with Minimal Coefficientlength"; Delft University of Technology; The Netherlands; Sep. 11, 1997.
Uming Ko et al., "A Self-Timed Method to Minimize Spurious Transitions In Low Power CMOS Circuits", Low Power Electronics, 1994, Digest of Technical Papers, IEEE Symposium, San Diego CA, USA, Oct 10, 1994, pp. 62-63.
Vivek Tiwari, "Guarded evaluation: pushing power management to logic synthesis/design", IEEE Transactions on Computer-Aided Design of Integrated Circuits and Systems, vol. 17, No. 10, Oct 10, 1998, pp. 1051-1060.
Supplementary Search Report for EP 01 90 6088.

* cited by examiner

Primary Examiner—Tan V. Mai
(74) Attorney, Agent, or Firm—Pearl Cohen Zedek Latzer, LLP

(57) ABSTRACT

A wave digital filter which includes a plurality of memoryless adapters each having two or more ports, each port including an input and an output, and at least one controlled gate which delays the propagation of a value into at least one input of at least one of the adapters.

22 Claims, 12 Drawing Sheets

WAVE DIGITAL FILTER WITH LOW POWER CONSUMPTION

FIELD OF THE INVENTION

The present invention relates to digital filters and in particular to wave digital filters.

BACKGROUND OF THE INVENTION

Wave digital filters (WDFs) are a sub-class of digital filters which are considered to have a good dynamic range, low round-off noise, and inherent stability. WDFs are especially useful in digital processing when it is desired to minimize the number of bits used in the filter's coefficients. A general description of WDFs may be found in Alfred Fettweis, "Wave Digital Filters: Theory and Practice", proceedings of the IEEE, Vol. 74, No. 2, February 1986, the disclosure of which is incorporated herein by reference.

WDFs generally comprise a plurality of cascaded adapters, memory elements and inverters, which are organized to form digital equivalents of known analog filters. The memory elements and inverters are used to construct digital equivalents of basic analog elements, such as capacitors and inductors, and the adapters are used to interconnect the memory elements and inverters which represent the different basic analog elements of the known analog filters.

The adapters are combinatorial (memoryless) elements which include multipliers and adders. Generally, the adapters have a plurality of ports, usually either two or three ports, each port including an input and an output.

FIGS. 1A and 1B are a schematic block diagram of a seventh order WDF 20 known in the art. WDF 20 comprises seven cascaded three port adapters 22. Each adapter comprises three input lines ($In_1$, $In_2$, $In_3$) and three output lines ($Out_1$, $Out_2$, $Out_3$). One of the ports, of each adapter 22, is preferably connected to a respective register 24 which stores an internal state value of WDF 20. The other two ports of each adapter 22 (except the extreme adapters 22A and 22G) are connected to respective ports of neighboring adapters 22. Adapter 22A preferably receives an input value of filter 20 through its input line $In_1$ 26, and adapter 22G provides an output of the filter on its $Out_1$ output line 28. Typically, a constant zero value is provided to the $In_1$ input line of adapter 22G. It is noted that the orientations of adapters 22, i.e., their port connections, vary.

The seven adapters 22 comprise four constrained serial adapters 22A, 22C, 22E and 22G, two constrained parallel adapters 22B and 22F, and a single unconstrained parallel adapter 22D. Constrained serial adapters 22A, 22C, 22E and 22G are governed by the following equations:

$$Out_1 = In_1 - \alpha(In_1 + In_2 + In_3)$$

$$Out_2 = In_3 - Out_1$$

$$Out_3 = -In_1 - In_2 \quad (1)$$

Constrained parallel adapters 22B and 22F follow the following equations:

$$Out_1 = In_3 + (1-\alpha)(In_2 - In_1)$$

$$Out_2 = In_3 - \alpha(In_2 - In_1)$$

$$Out_3 = In_2 - \alpha(In_2 - In_1) \quad (2)$$

Unconstrained parallel adapter 22D follows the following equations:

$$Out_1 = In_3 + (1-\alpha_1)(In_3 - In_1) - \alpha_2(In_3 - In_2)$$

$$Out_2 = In_3 - \alpha_1(In_3 - In_1) + (1-\alpha_2)(In_3 - In_2)$$

$$Out_3 = In_3 - \alpha_1(In_3 - In_1) - \alpha_2(In_3 - In_2) \quad (3)$$

In these equations $\alpha$, $\alpha_1$, and $\alpha_2$ are coefficients of the respective adapters 22, and have values determined separately for each adapter. It is noted that different types of adapters have different numbers of coefficients. The coefficients determine the frequency response (i.e., the transfer function) of the WDF. Methods for selecting appropriate values for the coefficients are described, for example, in the above mentioned reference of Alfred Fettweis.

As with other filters it is desired to minimize their power consumption.

For compactness of the adapters, in order to save, time, space and power consumption, the different outputs of the adapters are calculated using common hardware. For example, in the constrained serial adapters, the result of calculating $Out_1$ is used in calculating $Out_2$. FIGS. 2A, 2B and 2C are schematic illustrations of the structures of a constrained serial adapter 30, a constrained parallel adapter 32 and an unconstrained parallel adapter 34, known in the art. Adapters 30, 32 and 34 are specific implementations of adapters which may be used as the adapters 22 of filter 20. Adapters 30, 32 and 34 comprise adders 52, inverters 54, and multipliers 56, organized in a manner which carries out, respectively, equations (1) (2) and (3).

A paper titled "Design of Wave Digital Filters with Minimal Coefficientlength" by Manshanden and Nouta, Delft University of Technology, The Netherlands, Sep. 11, 1997, the disclosure of which is incorporated herein by reference, suggests reducing the length of the coefficients multiplied by the adapters of a WDF, in order to reduce the chip die size of the WDF. In addition, the paper suggests reducing the chip die size and the power consumption of a WDF by limiting the number of '1' bits in the coefficients. Still, additional reduction in power consumption is desired.

SUMMARY OF THE INVENTION

An aspect of some preferred embodiments of the invention relates to a wave digital filter which includes at least one delay unit which prevents propagation of non-valid (i.e., temporary incorrect values) calculation results within the WDF. As toggles of values between '0's and '1's are responsible for most of the power consumption of the WDF, by preventing propagation of non-valid results, unnecessary toggles of values are eliminated and the power consumption is substantially reduced.

The main reason for the power consumption of the WDF, is the large combinatorial logical parts of the WDF which receive different inputs at different times. When the input to the filter changes (including changes in internal states), the combinatorial adapters change their outputs and thus cause back and forth propagations of values through the WDF until all the outputs of all the adapters stabilize. By preventing adapters of the WDF from receiving non-valid values and/or from providing output values before all the input values required to calculate the output value are valid, these back and forth propagations are substantially eliminated.

In a preferred embodiment of the present invention, the at least one delay unit includes one or more latches and/or other gates which are kept closed when the values they hold are not valid and are opened when the values they hold become valid.

In a preferred embodiment of the present invention, the at least one delay unit is used to delay valid values from reaching an adapter before one or more other inputs of the adapter become valid. The at least one delay unit preferably delays the valid values so that the inputs which are required by the adapter in order to perform a calculation are received at substantially the same time. Thus, the adapter performs only a single calculation responsive to a plurality of concurrently changing values, rather than a plurality of calculations responsive to a plurality of changing values.

There is therefore provided in accordance with a preferred embodiment of the present invention, a wave digital filter, which includes a plurality of memoryless adapters each having two or more ports, each port including an input and an output, and at least one controlled gate which delays the propagation of a value into at least one input of at least one of the adapters.

Preferably, the at least one controlled gate includes at least one latch. Alternatively or additionally, the at least one controlled gate includes at least one strobe gate. Preferably, the at least one controlled gate is opened when the value it delays is expected to be valid.

Preferably, the value delayed by the at least one controlled gate is required for performing a function and the controlled gate is opened when all the values required for performing the function are expected to be valid. Preferably, the at least one controlled gate is opened when substantially all the values entering the at least one of the adapters are expected to be valid. Preferably, the filter includes at least one delay unit which delays the propagation of a value into at least one input of at least one of the adapters for a predetermined time. Preferably, the at least one delay unit includes at least one controlled gate and/or at least one uncontrolled delay element. Preferably, the at least one delay unit delays the propagation of a value such that the value is inputted into an adapter substantially concurrently with another value received by the adapter. Preferably, the value whose propagation is delayed for the predetermined time includes a valid value.

Preferably, at least one of the at least one controlled gate is located within an adapter. Preferably, at least some of the plurality of adapters are three-port adapters. Preferably, the value delayed from propagating into the adapter is received from a different adapter. Preferably, the wave digital filter provides one or more results and the at least one controlled gate does not affect the results provided by the wave digital filter. Preferably, each of the at least one of the adapters to which propagation of values are delayed includes at least one multiplier. Preferably, each of the plurality of adapters includes at least one multiplier.

Preferably, the plurality of adapters include at least two or three different types of adapters. There is further provided in accordance with a preferred embodiment of the present invention, a wave digital filter, including a plurality of memoryless adapters each having two or more ports, each port including an input and an output, and at least one delay unit which delays the propagation of a first value into at least one input of at least one of the adapters such that the first value is received substantially concurrently with a second value at another input of the adapter. Preferably, the at least one delay unit includes a controlled gate and/or an uncontrolled delay element.

There is further provided in accordance with a preferred embodiment of the present invention, a method of filtering a signal using a wave digital filter, including providing an input which carries a value required for performing a calculation by a memoryless adapter of the wave digital filter, delaying the input until its value is valid, and providing the valid value to the adapter.

Preferably, providing the input includes providing an input which carries a result from a different adapter. Preferably, delaying the input includes delaying for a predetermined time. Alternatively or additionally, delaying the input includes delaying until all the inputs required for performing the calculation are valid. Preferably, delaying the input includes delaying the input in a latch and/or in a strobe gate.

There is further provided in accordance with a preferred embodiment of the present invention, a method of filtering a signal using a wave digital filter, including providing a first input which carries a value required for performing a calculation by a memoryless adapter of the wave digital filter, delaying the value on the first input until a valid value is received on a second input of the adapter, and providing the delayed value to the adapter.

Preferably, delaying the value on the first input includes delaying for a predetermined time. Preferably, delaying the value on the first input includes delaying the value using a latch and/or an uncontrolled delay element.

There is further provided in accordance with a preferred embodiment of the present invention, a method of filtering a signal using a wave digital filter which includes a plurality of adapters, each adapter calculating a plurality of output values, including providing a clock signal to the filter, and initiating calculation of one or more output values of a first group of less than all the adapters of the filter, responsive to the provided clock signal.

Preferably, initiating calculation includes initiating calculation of less than all the output values of the adapters of the first group. Preferably, the method includes initiating calculation of one or more output values of a second group of less than all the adapters of the filter, different from the first group, after the termination of the calculation of the one or more output values of the adapters of the first group. Preferably, the first and second groups do not include common adapters.

Preferably, the method includes initiating calculation of one or more additional output values of the adapters of the first group, different from the output values previously calculated, after calculating the one or more output values of the second group of adapters. Preferably, the calculation of the additional output values of the first group of adapters depends on at least one of the one or more output values of the second group of adapters. Preferably, the calculation of the output values of the second group of adapters depends on at least one of the one or more output values of the first group of adapters. Preferably, initiating calculation of output values of less than all the adapters includes delaying input values to at least some of the adapters not included in the first group.

BRIEF DESCRIPTION OF FIGURES

The invention will be more clearly understood by reference to the following description of preferred embodiments thereof in conjunction with the figures, in which.

DETAILED DESCRIPTION OF THE PREFERRED EMBODIMENTS

Figure 3:
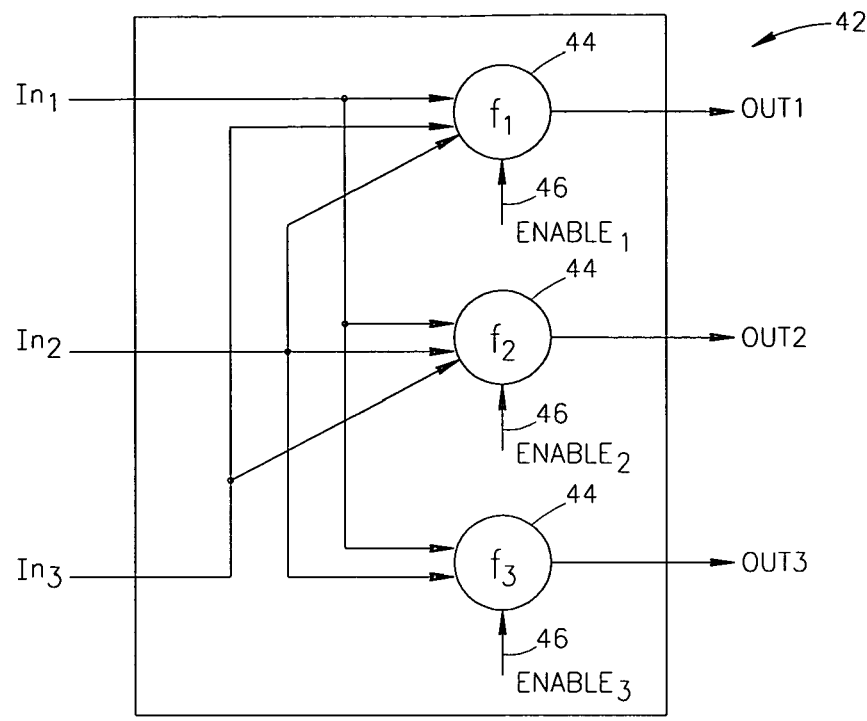
FIG. 3 is a functional diagram of a three-port constrained adapter, in accordance with a preferred embodiment of the present invention.

FIG. 3 is a functional diagram of a three-port constrained adapter 42, in accordance with a preferred embodiment of the present invention. Adapters having the functionality of adapter 42, as described hereinbelow, are preferably used in wave digital filters, for example, in filter 20.

Adapter 42 comprises three inputs $In_1$, $In_2$ and $In_3$ and three outputs $Out_1$, $Out_2$ and $Out_3$. Three functional units $f_1$, $f_2$ and $f_3$ (44), comprising combinatorial logic, calculate the signals provided on the respective outputs $Out_1$, $Out_2$ and $Out_3$. It is noted that functional units 44 may comprise common elements and are shown separately only to illustrate their functions. Enable lines 46 provide control signals which enable/disable the operation of functional units 44. When enable line 46 provides an enabling value, the respective functional unit 44 calculates its respective output based on its current input values. When enable line 46 is disabled, its respective functional unit 44 does not operate and does not substantially consume power. Preferably, lines 46 are enabled only when all the inputs of the respective functional unit 44 are valid. Thus, the power consumption of adapter 42 is substantially reduced as most unnecessary calculations are not performed. As adapter 42 does not change its outputs until all its inputs are valid, also the power consumption of neighboring adapters in a WDF is substantially reduced. It is noted that adapter 42 is similar to adapters of the prior art, except for the presence of the function provided by enable lines 46.

Figure 4:
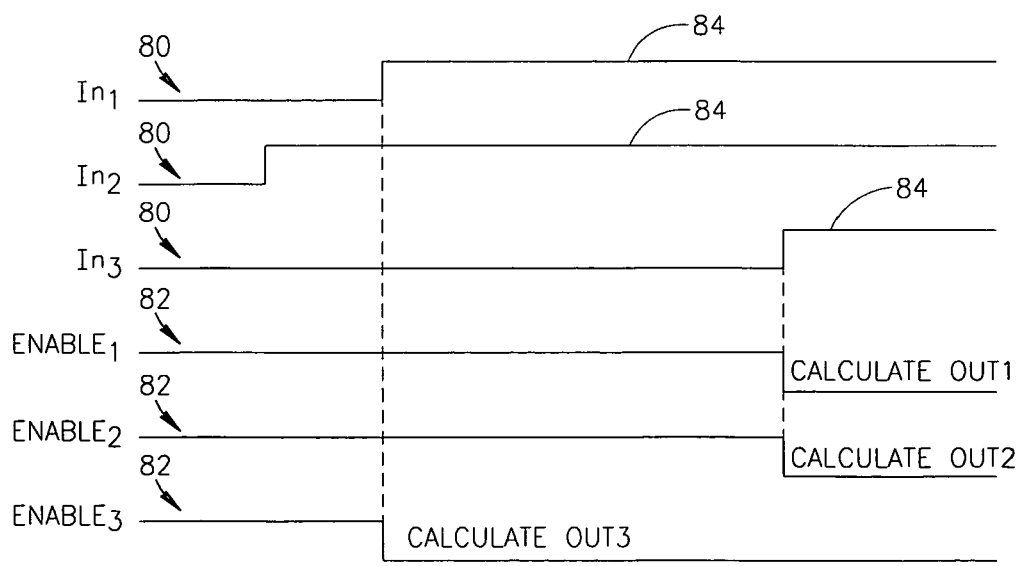
FIG. 4 is a time chart of the operation of the adapter of FIG. 3, in accordance with a preferred embodiment of the present invention.

FIG. 4 is a time chart of the operation of adapter 42, in accordance with a preferred embodiment of the present invention. The time chart includes lines 80 which indicate whether the respective inputs of adapter 42 are valid, showing time spans 84 in which the respective inputs are valid. In addition, the time chart includes lines 82 which show the values carried by enable lines 46. The enable line 46 of each functional unit 44 is preferably enabled only when all the inputs of the unit are valid. After inputs $In_1$ and $In_2$ of adapter 42 become valid the enable line 46 of functional unit $f_3$ is enabled allowing the calculation of output $Out_3$, which depends only on the $In_1$ and $In_2$ inputs. When also input $In_3$ becomes valid, functional units $f_1$ and $f_2$ are enabled and outputs $Out_1$ and $Out_2$ which depend on all three inputs of adapter 42, are calculated.

Figure 1A:
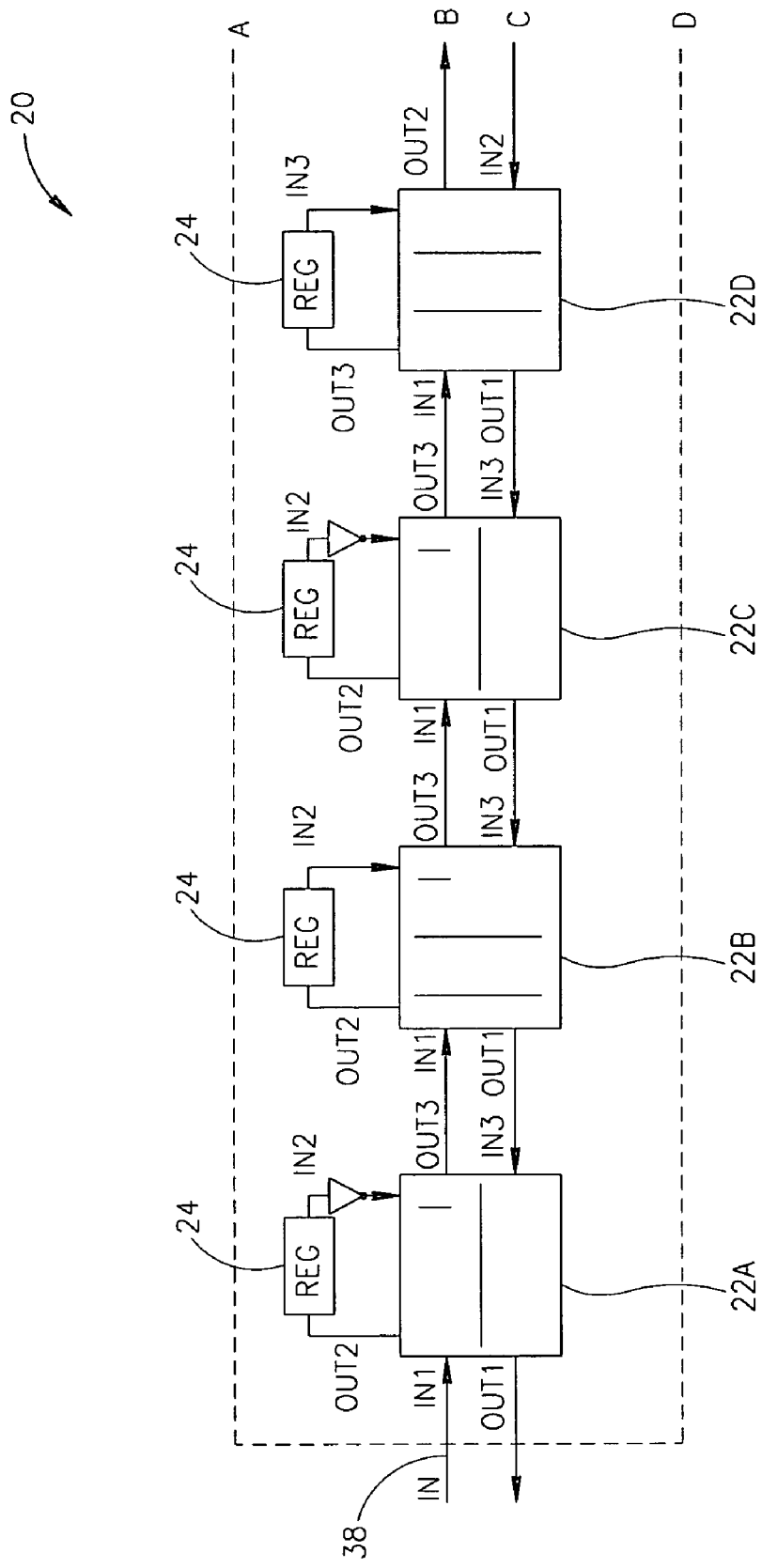
FIGS. 1A and 1B are a schematic block diagram of a wave digital filter known in the art.
Figure 1B:
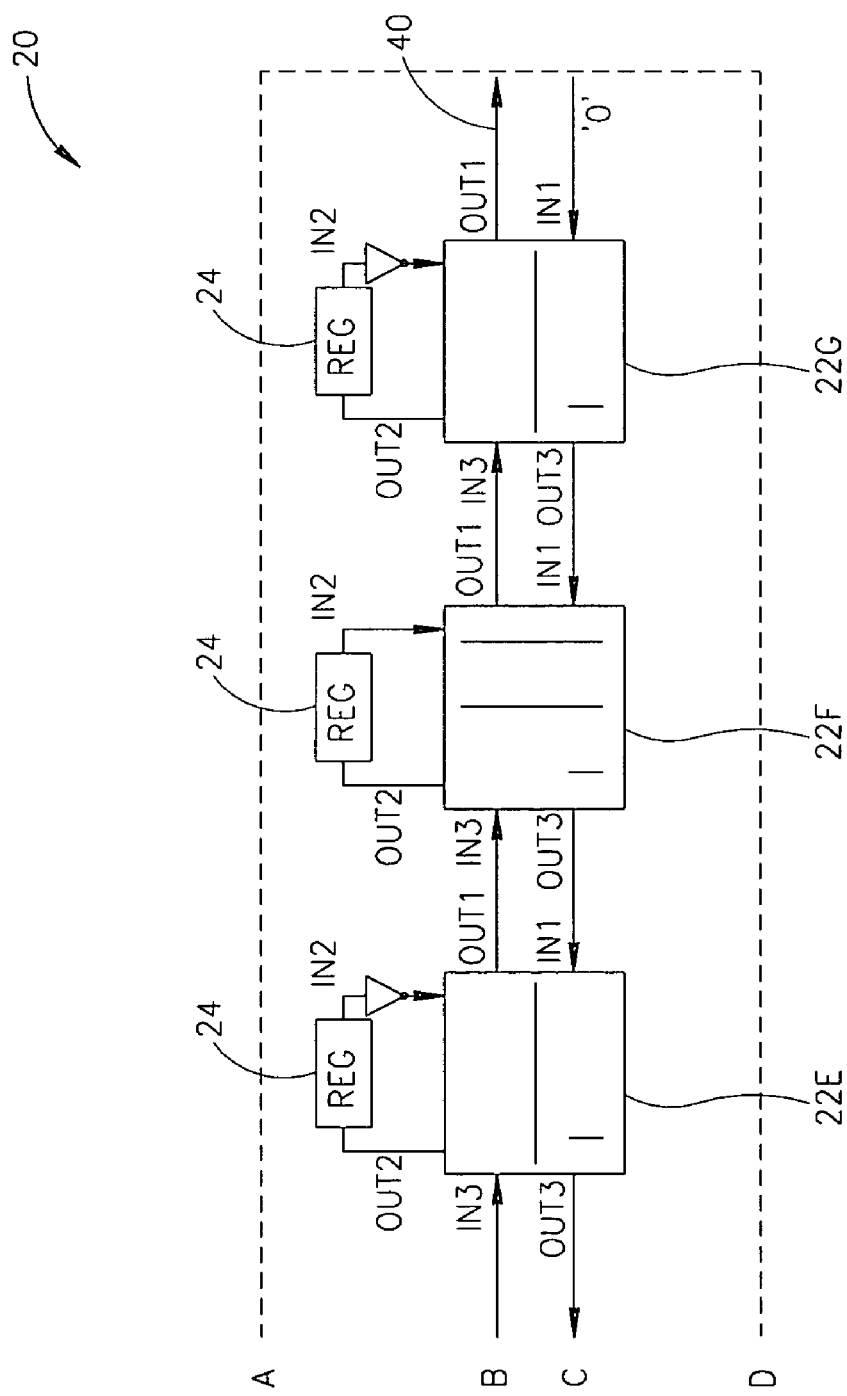

In a preferred embodiment of the invention, enable lines 46 are implemented, as described hereinbelow, using gates inserted within the adapters of filter 20. When this embodiment is implemented on filter 20 of FIG. 1, only the inner structure of adapters 22A, 22B, 22C, 22D, 22E, 22F and 22G change relative to the prior art, while the overall structure of the filter, as shown in FIGS. 1A and 1B remains unchanged.

Figure 5A:
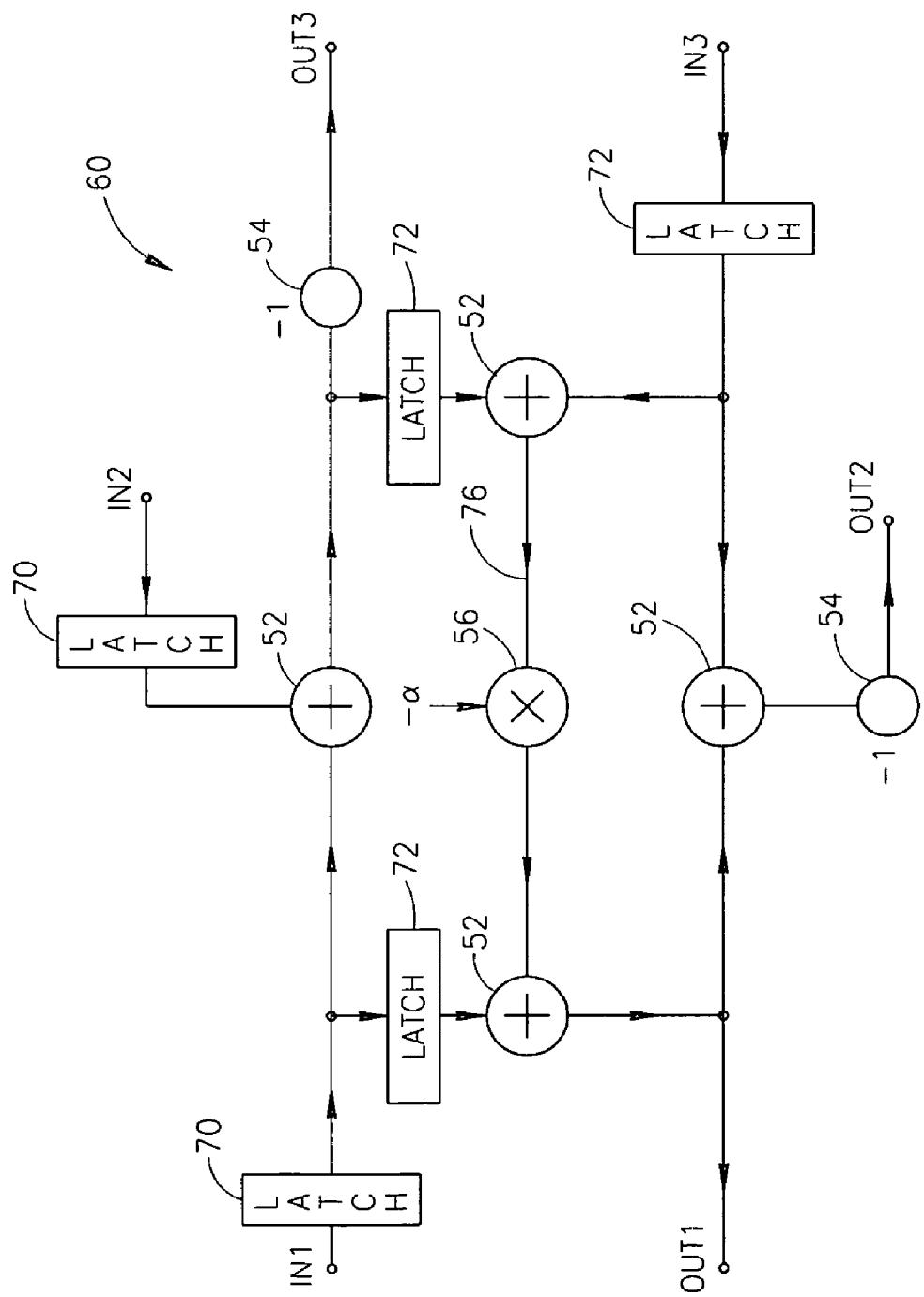
FIGS. 5A, 5B and 5C are schematic block diagrams of a constrained serial adapter, a constrained parallel adapter and an unconstrained parallel adapter, in accordance with a preferred embodiment of the present invention.

FIG. 5A is a schematic block diagram of a constrained serial adapter 60, in accordance with a preferred embodiment of the present invention. In the exemplary WDF of FIG. 1, adapter 60 is preferably used to implement some or all of adapters 22A, 22C, 22E and 22G.

Figure 5B:
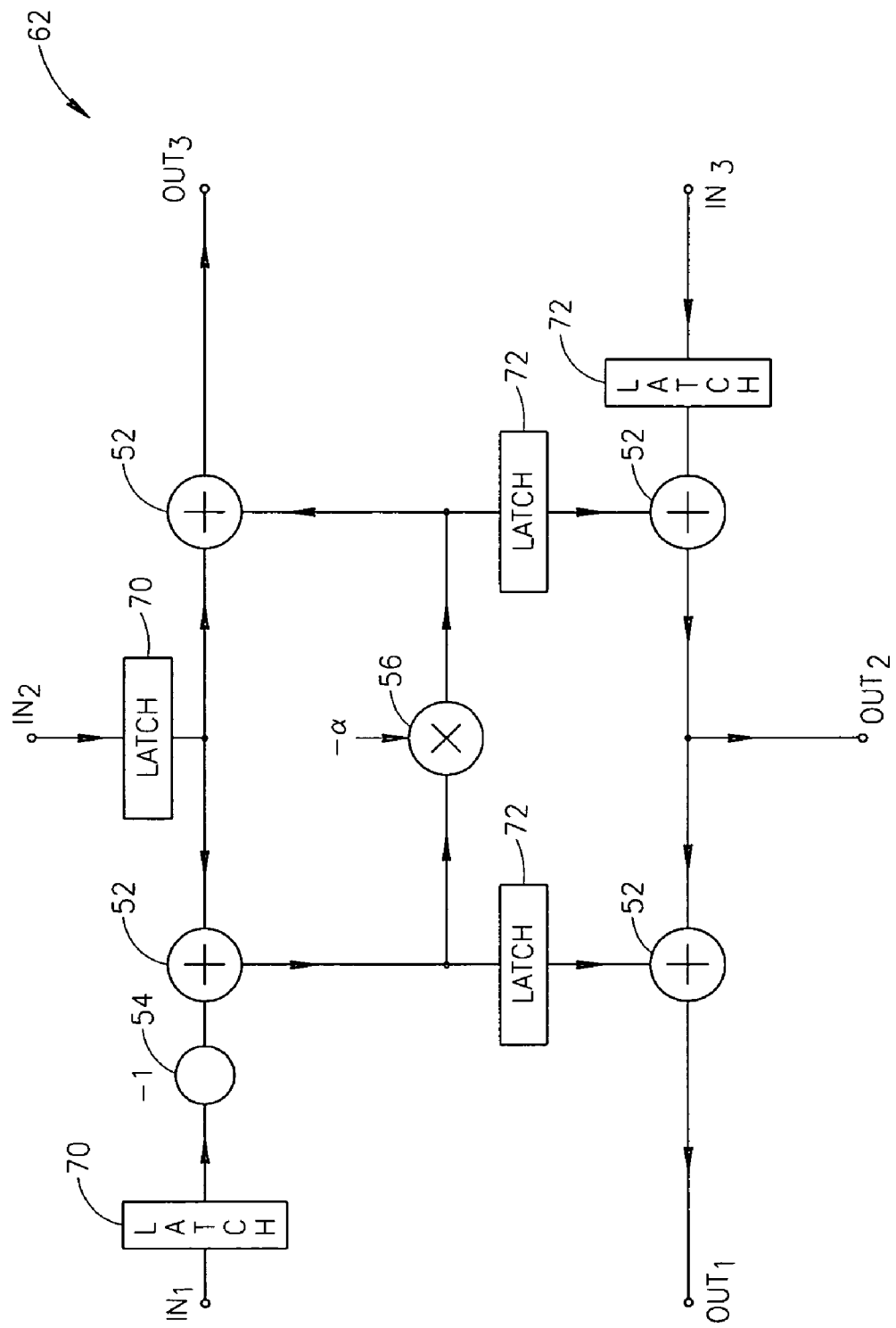

FIG. 5B is a schematic block diagram of a constrained parallel adapter 62, in accordance with a preferred embodiment of the present invention. In the exemplary WDF of FIG. 1, adapter 62 is preferably used to implement one or both of adapters 22B and 22F.

Serial adapter 60 and parallel adapter 62 are similar to serial adapter 30 and parallel adapter 32, respectively, but include additionally latches 70 and 72 which implement the enable functions described above with reference to FIGS. 3 and 4. Thus, adapters 60 and 62 comprise, respectively, clocked versions of combinatorial adapters 30 and 32.

Latches 70 and 72 are preferably situated on those lines within adapter 60 which may carry non valid values and/or on lines which may provide valid values for a calculation before other values required for the same calculation are valid.

In a preferred embodiment of the invention, latches 70 implement the enable function of output $Out_3$. At the beginning of each clock cycle of filter 20, latches 70 are preferably closed until both $In_1$ and $In_2$ are expected to be valid. Responsive to the opening of latches 70, $Out_3$ is calculated. At this point latches 72 remain closed such that only the logical units (i.e., the adder 52 and inverter 54) directly required for calculating $Out_3$ are operated (and consume power) due to the opening of latches 70.

Preferably, when input $In_3$ is expected to be valid, latches 72 are opened allowing the calculation of outputs $Out_1$ and $Out_2$. It is noted that the value of $Out_3$ is not recalculated with the opening of latches 72, as no changes occur in the values of inputs $In_1$ and $In_2$ after the opening of latches 70.

In order to have adapters 60 and 62 operate as quickly as possible, latches 70 and/or 72 are preferably opened as soon as possible after the signals held by the latches become valid.

In some preferred embodiments of the invention, latch 70 on input $In_1$ and latch 72 on input $In_3$ are not used, in order to reduce the die area and/or the complexity of adapter 60. Instead, the opening of the remaining latches 70 and 72 are timed to occur substantially at the same time as the time at which inputs $In_1$ and $In_3$, respectively, become valid. Alternatively or additionally, latch 70 on input $In_2$ is replaced by an uncontrolled delay element which delays the valid value received from the respective register 24 until the value on input $In_1$ is expected to be valid.

Figure 5C:
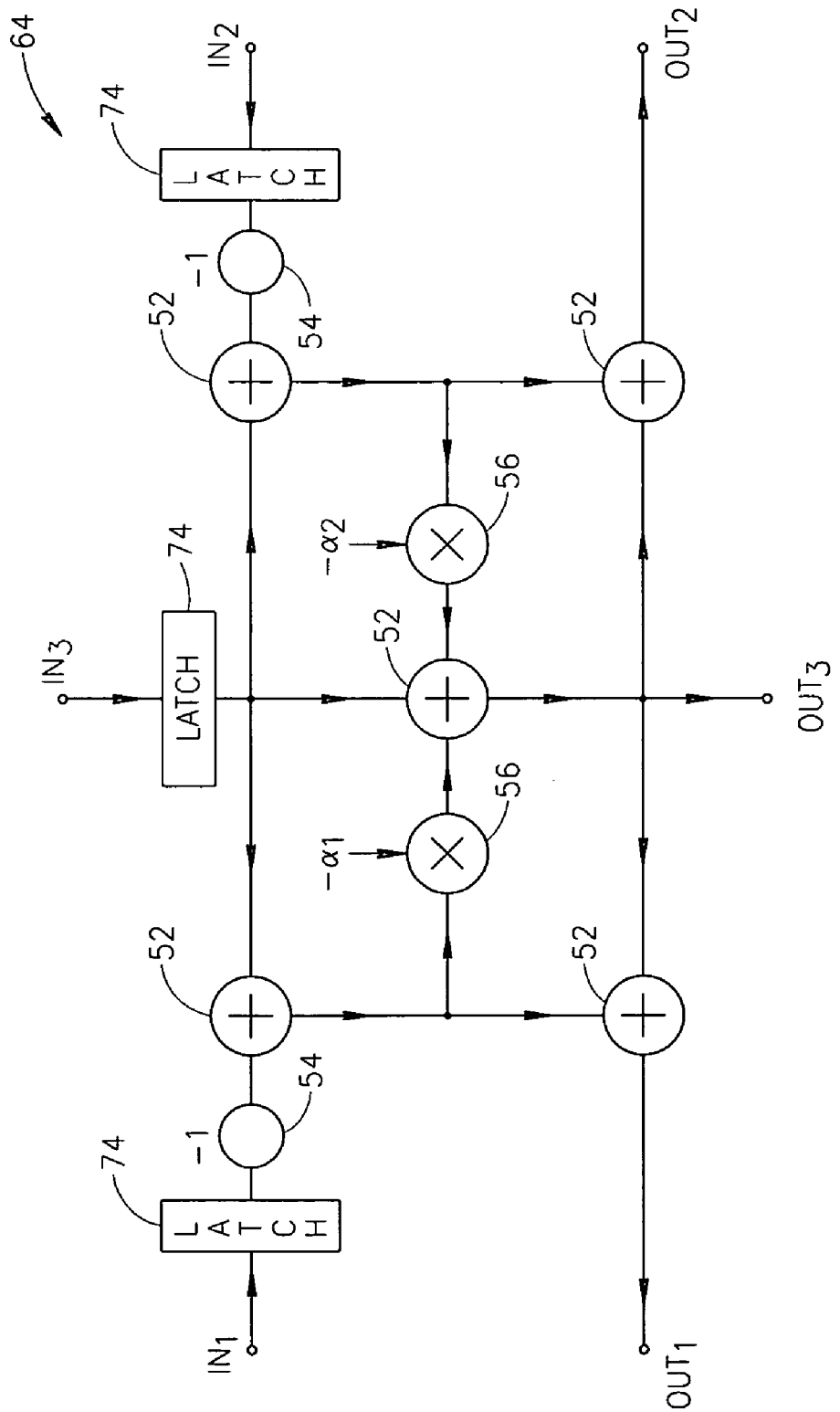

FIG. 5C is a schematic block diagram of an unconstrained parallel adapter 64, in accordance with a preferred embodiment of the present invention. In the exemplary WDF of FIG. 1, adapter 64 is preferably used to implement adapter 22D.

Adapter 64 is similar to adapter 34, but includes, additionally, latches 74 which implement the enable functions described above with reference to FIGS. 3 and 4. In unconstrained adapter 64, inputs $In_1$ and $In_2$ are expected to arrive at substantially the same time while input $In_3$ is valid much earlier. Preferably, when all three inputs of adapter 64 are valid, latches 64 are opened and all three outputs of the adapter are calculated.

Alternatively to having three latches 74, a single latch 74 latching input $In_3$ is used to provide $In_3$ to adapter 64 at the same time at which inputs $In_1$ and $In_2$ become valid. It is noted that as the inputs to previous adapters within filter 20 are also latched, inputs $In_1$ and $In_2$ of adapter 64 are expected to change only once (i.e., to the valid value) during a clock cycle of the filter. Further alternatively or additionally, latch 74 latching input $In_3$ is replaced by an uncontrolled delay element which delays the valid value received from the respective register 24 until inputs $In_1$ and $In_2$ become valid.

Figure 6:
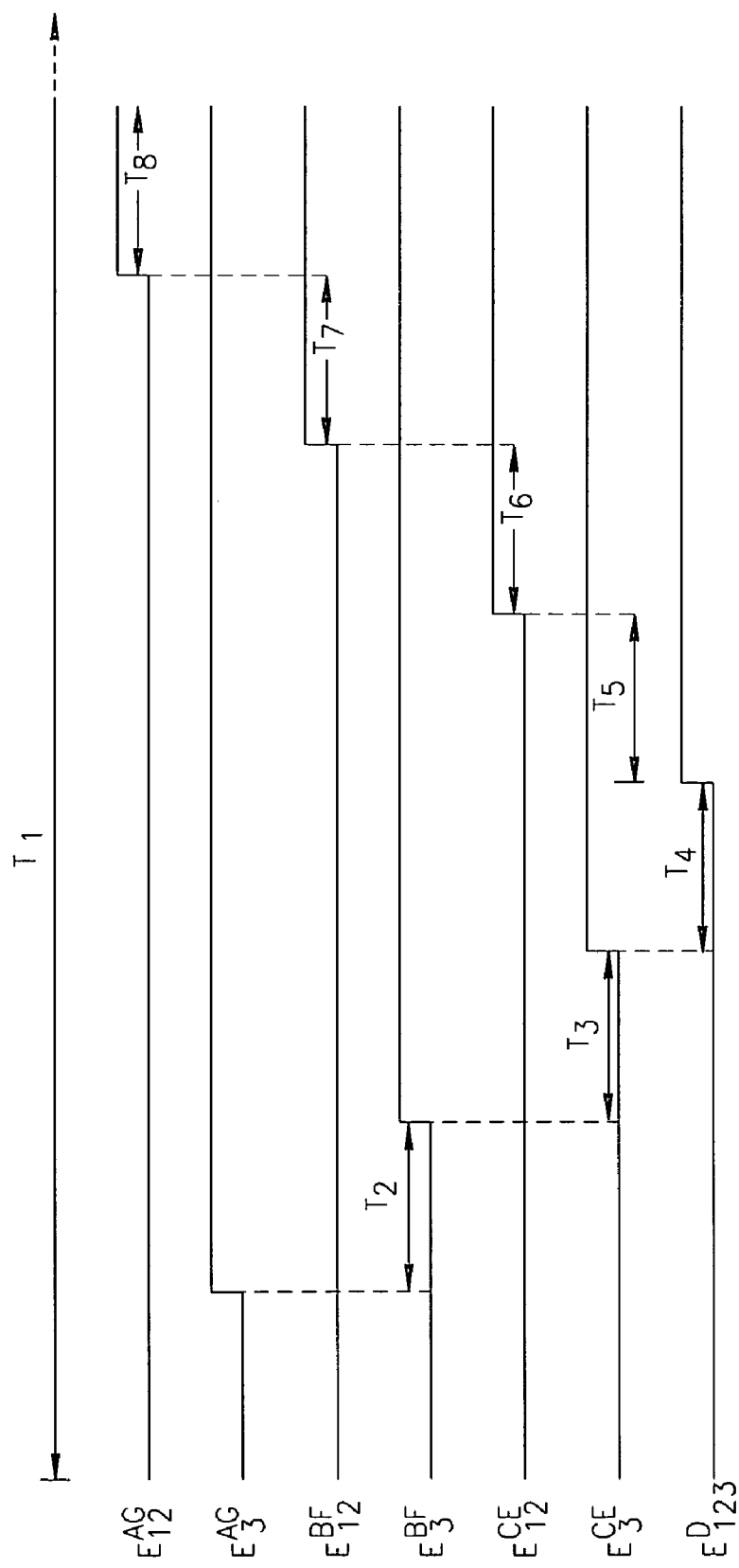
FIG. 6 is a time chart of the operation of a wave digital filter, in accordance with a preferred embodiment of the present invention.

FIG. 6 is a time chart of the operation of filter 20, in accordance with a preferred embodiment of the present invention in which all of adapters 22 are implemented using adapters 60, 62 or 64. Preferably, a clock cycle T1 governs the operation of filter 20. That is, every T1 seconds, input signals are provided to filter 20 (typically before the rising or falling edge of the clock cycle), registers 24 are updated and output values are provided by the filter. Thus, once during each clock cycle T1, registers 24 and input line 38 may take on new values. An enable signal $E_3^{A,G}$ immediately opens latches 70 of adapters 22A and 22G and responsive to the new values, adapters 22A and 22G begin to calculate new values for their $Out_3$ outputs. Alternatively, adapters 22A and 22G do not include latches 70. After a time T2, when the $In_1$ and $In_2$ inputs of adapters 22B and 22F are expected to be valid, an enable signal $E_3^{B,F}$ opens latches 70 of adapters 22B and 22F.

After a time T3, when the $In_1$ and $In_2$ inputs of adapters 22C and 22E are expected to be valid, an enable signal $E_3^{C,E}$ opens latches 70 of adapters 22C and 22E. After an additional time T4, when the $In_1$, $In_2$ and $In_3$ inputs of adapter 22D are expected to be valid, an enable signal $E_{1,2,3}^D$ opens latches 74 of adapter 22D.

After a propagation time T5, all the outputs of adapter 22D are valid and an enable signal $E_{1,2}^{C,E}$ opens latches 72 of adapters 22C and 22E, such that adapters 22C and 22E calculate their $Out_1$ and $Out_2$ outputs. After a time T6, an enable signal $E_{1,2}^{B,F}$ opens latches 72 of adapters 22B and 22F, initiating the calculation of their $Out_1$ and $Out_2$ outputs. After an additional time T7, an enable signal $E_{1,2}^{A,G}$ opens latches 72 of adapters 22A and 22G and during a time T8, adapters 22A and 22G calculate their $Out_1$ and $Out_2$ outputs. At this time, a clock cycle T1 of filter 20 may end. The length of T8 is preferably set such that the output of filter 20 and all the values incident on registers 24 are always valid at the end of cycle T1.

Preferably, the times T2, T3 and T4 are propagation delay times of adapters 22A and 22G, 22B and 22F, and 22C and 22E, respectively, from their $In_1$ and $In_2$ inputs to their $Out_3$ outputs. Similarly, T5 is preferably the propagation delay time of unconstrained adapter 22D. The times T6, T7, and T8, are preferably propagation delay times of adapters 22C and 22E, 22B and 22F, and 22A and 22G, respectively, from their $In_3$ input to their $Out_1$ and $Out_2$ outputs.

In a preferred embodiment of the invention, the above propagation times comprise average propagation times, in order to minimize the time delay caused by the addition of latches 70, 72 and 74. Alternatively or additionally, some or all of the above propagation times comprise maximal propagation times, such that latches 70, 72 and/or 74 are always opened after the signals they delay are valid, so as to maximize the power saving. In this alternative, the clock cycle T1 of filter 20 is slightly longer than for a filter without latches 70, 72 and 74, as each latch waits the maximal propagation time before it is opened.

In some preferred embodiments of the invention, times T2, T3, T4, T5, T6 and/or T7 are set in a manner which minimizes the power consumption and/or minimizes the cycle time T1 of filter 20. Preferably, simulations are performed to choose T2, T3, T4, T5, T6 and/or T7 which provide best power consumption results and/or fastest operation times.

In a preferred embodiment of the invention, latches 70, 72 and/or 74 are opened at times chosen such that the propagation times from the different inputs of an adapter 22 end at the same time.

In some preferred embodiments of the invention in which fewer latches are used than shown in FIGS. 5A, 5B and/or 5C, the above mentioned propagation times are chosen to minimize the time difference between the arrival of valid values on the non-latched inputs and the opening of the latches. Preferably, in these embodiments, the times of opening of the latches are the average propagation times of the non-latched inputs.

Alternatively or additionally, some or all of times T2, T3, T4, T4, T6, T7, and T8 are set so as to simplify the operation of filter 22. In a preferred embodiment of the invention, some or all of T2, T3, T4, T5, T6, T7, and T8 which have values close to each other are given a common value so as to simplify the control of latches 70, 72 and/or 74. For example, in a preferred embodiment, times T2, T3, T4, T5, T6, T7, and/or T8 are adjusted to be equal multiples of a standard clock rate of a clock used by filter 20.

Further alternatively or additionally, instead of using latches 70 to delay valid values from registers 24, the clock signal controlling the updating of the register is delayed. In a preferred embodiment, the clock signal is delayed by a time period shorter than could cause the register 24 to store an incorrect value. Alternatively or additionally, a latch is added at the entrance to the register 24 preventing a wrong value from reaching the register.

It is noted that although in the above example adapters 22A and 22G, 22B and 22F, and 22C and 22E receive identical enable signals, in some preferred embodiments of the invention according to the specific propagation times of the filter, each adapter 22 receives different enable signals. Furthermore, functional units $f_1$ and $f_2$ do not necessarily receive the same enable signal.

Following is a simplistic evaluation of the power savings achieved in accordance with the above described preferred embodiment of the invention. It is noted that the following evaluation is only a rough estimate and includes many simplifications. Using the above described procedure, the adapters 22 of filter 20 each perform a single calculation. Adapter 22D performs its calculations in a single step while constrained adapters 22A, 22B, 22C, 22E, 22F and 22G perform their calculations in two steps. It is noted, however, that the fact that the calculations are performed in two steps does not add to the power consumption of the adapters as calculations performed during the first step, i.e., calculation of $Out_3$, are not repeated in the second step.

Assuming that adapters 22 require power P for each calculation, the total power consumption in a single time cycle T1 of a filter 20 including latches 70, 72 and 74, is 7P. Conversely, in a filter 20 without latches 70, 72 and 74, adapter 22D performs up to four calculations until its outputs are valid, adapters 22C and 22E perform up to five calculations, adapters 22B and 22F perform up to six calculations and adapters 22A and 22G perform up to seven calculations. Thus, filter 20 without latches 70, 72 and 74 consumes up to 40P which is about six times the power consumption of filter 20 with latches 70, 72 and 74. It is noted that the power consumption of latches 70, 72 and 74, and of control lines of the latches (which preferably include only a single bit) are substantially negligible relative to the power consumption of adapters 22. It is further noted that the reduction in power consumption is achieved at the cost of enlarging the chip die size of filter 20. The additional chip die area of filter 20 due to latches 70, 72 and 74 is, however, relatively small. It is noted that in tests performed by the inventors of the present invention, a power saving of over a factor of ten was achieved under some circumstances.

In some preferred embodiments of the present invention, latches are inserted in fewer than all of the adapters of a filter and/or fewer latches are inserted than described above. Furthermore, in some embodiments, one or more of latches 70, 72 and 74 are located along different lines from those shown in FIGS. 5A, 5B and 5C. For example, some of latches 70, 72 and/or 74 may be located on output lines of adjacent adapters rather than on their input lines.

In a preferred embodiment, in order to keep filter 20 relatively simple and/or in order to save chip die area, the filter comprises only latches which prevent a high number of repetitive unnecessary calculations. The number of latches included in a wave digital filter is substantially a compromise between the power consumption of the filter and the simplicity and chip die area of the filter.

In a preferred embodiment of the present invention, coefficients $\alpha$, $\alpha_1$, and $\alpha_2$ are optimized to include very few '1' bits such that the multiplications performed by multiplier 56 will be as simple as possible and will consume very little power. In a preferred embodiment of the invention, the coefficients include up to two '1's. Thus, each multiplier can be implemented with at most one adder.

Referring for example to FIG. 5A, in some preferred embodiments of the invention, most of the power consumption of adapter 60 is due to multiplier 56. Therefore, in a preferred embodiment of the invention, instead of multiple latches 72, a single latch is located on line 76. In this embodiment, when latches 70 are opened all of the logical units of adapter 60 operate except multiplier 56. Therefore, responsive to the opening of latches 70, four adders 52 and two inverters 54 operate, of which the operation of only one adder 52 and one inverter 54 leading to output $Out_3$ are required. Assuming, for example, that the power consumption of inverters 54 is negligible and that multiplier 56 consumes six times the power consumed by a single adder 52, the use of a single latch instead of three latches 72 increases the power consumption of adapter 60 by about 30%. It is noted that for higher relative power consumption levels of multiplier 56, the increase in the power consumption is lower. It is noted that in the above example, by using fewer latches 72 output $Out_1$ changes before its value is valid. If the adapter receiving output $Out_1$ does not have a latch 70 on its respective input line (as suggested as an alternative hereinabove with reference to FIGS. 5A and 5B) the additional power consumption due to the use of fewer latches 72 increases.

Although in the above description latches 70, 72 and 74 have been described as being located within adapters 22, the latches may be located outside of the adapters. Such location of the adapters may be used, for example, when the adapters have a specific layout which it is not desired to change or when the adapters are implemented using off the shelf elements. Alternatively or additionally, the adapters may be constructed without latches 70, 72 and/or 74 when it is desired to produce a wave digital filter with two modes: a low power consumption mode and a high power consumption mode. It is noted that the low power consumption mode may be slower than the high power consumption mode as described hereinabove.

Figure 2A:
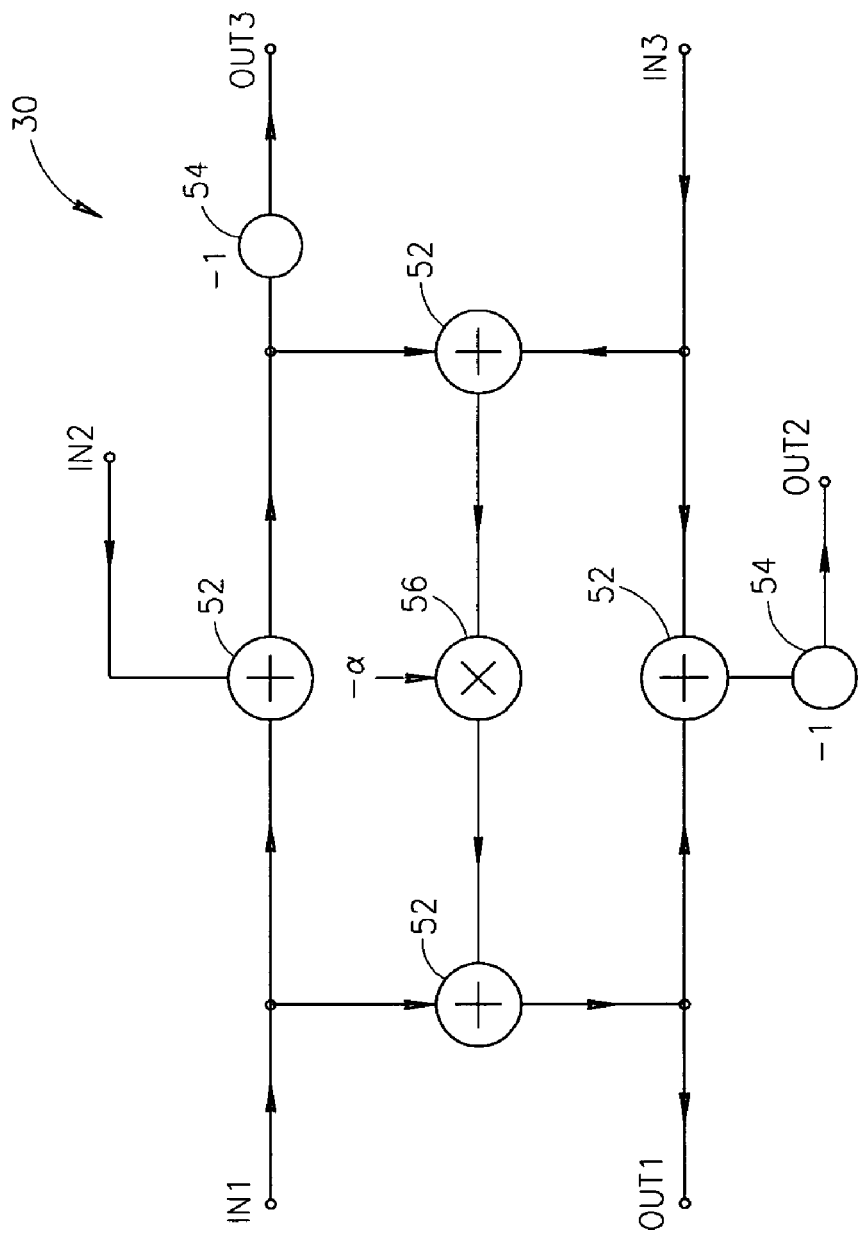
FIGS. 2A, 2B and 2C are schematic block diagrams of adapters known in the art.
Figure 2B:
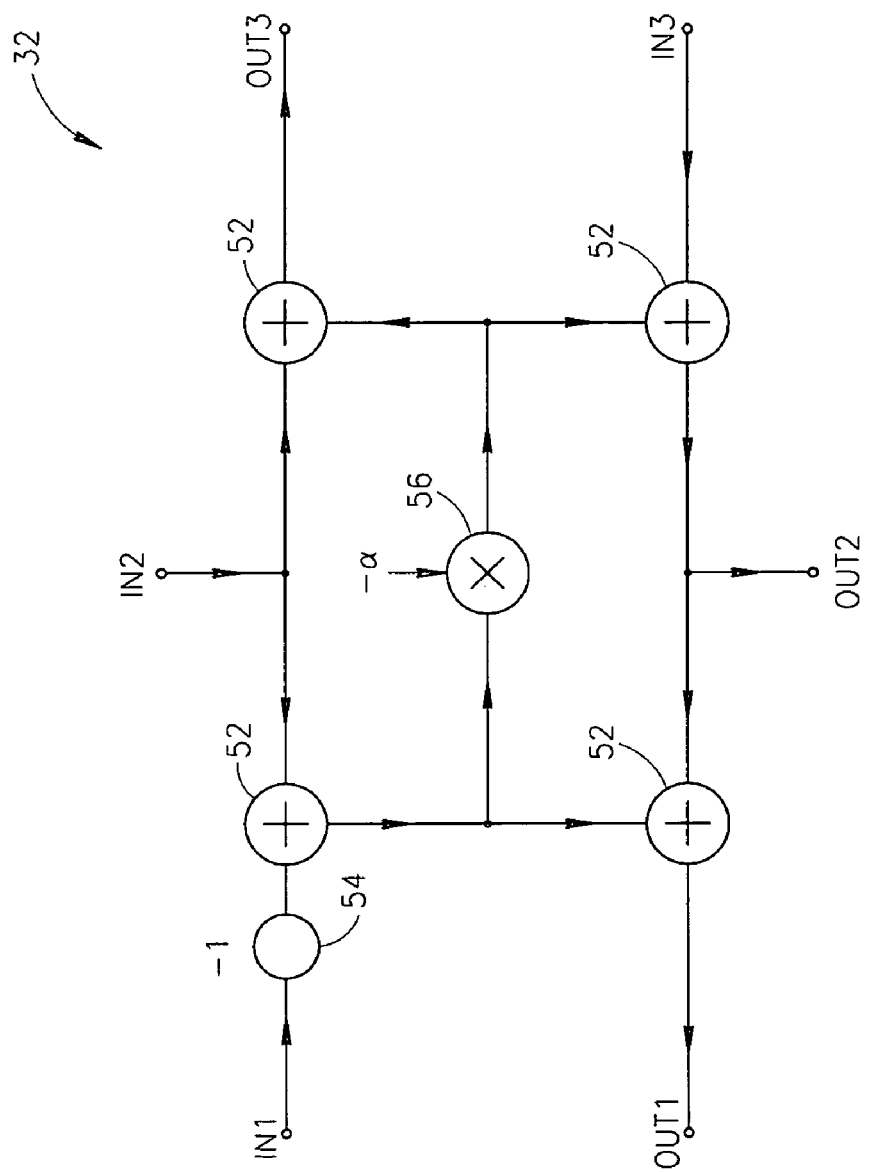
Figure 2C:
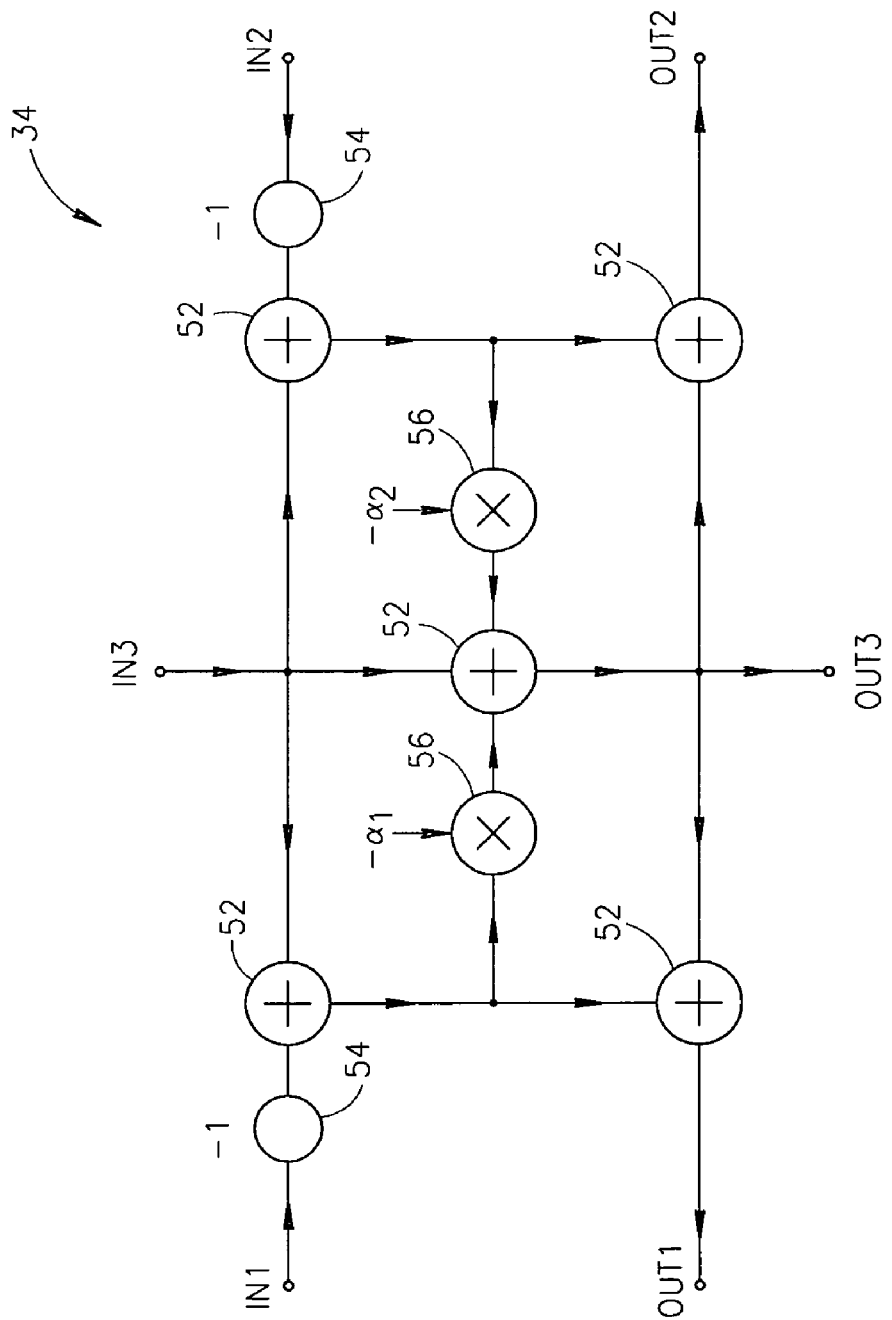
Figure 7A:
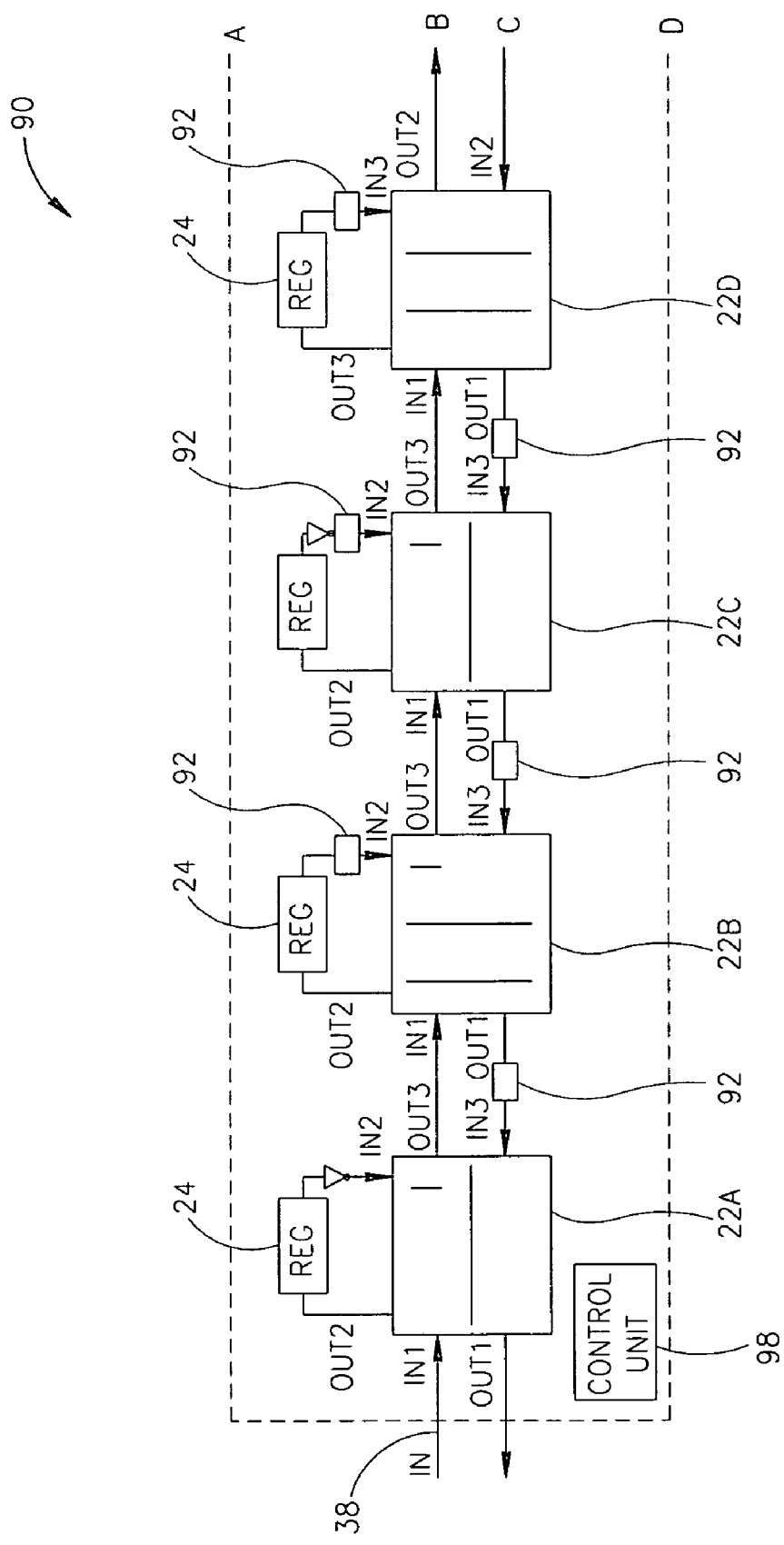
FIGS. 7A and 7B are a schematic block diagram of a wave digital filter, in accordance with a preferred embodiment of the present invention.
Figure 7B:
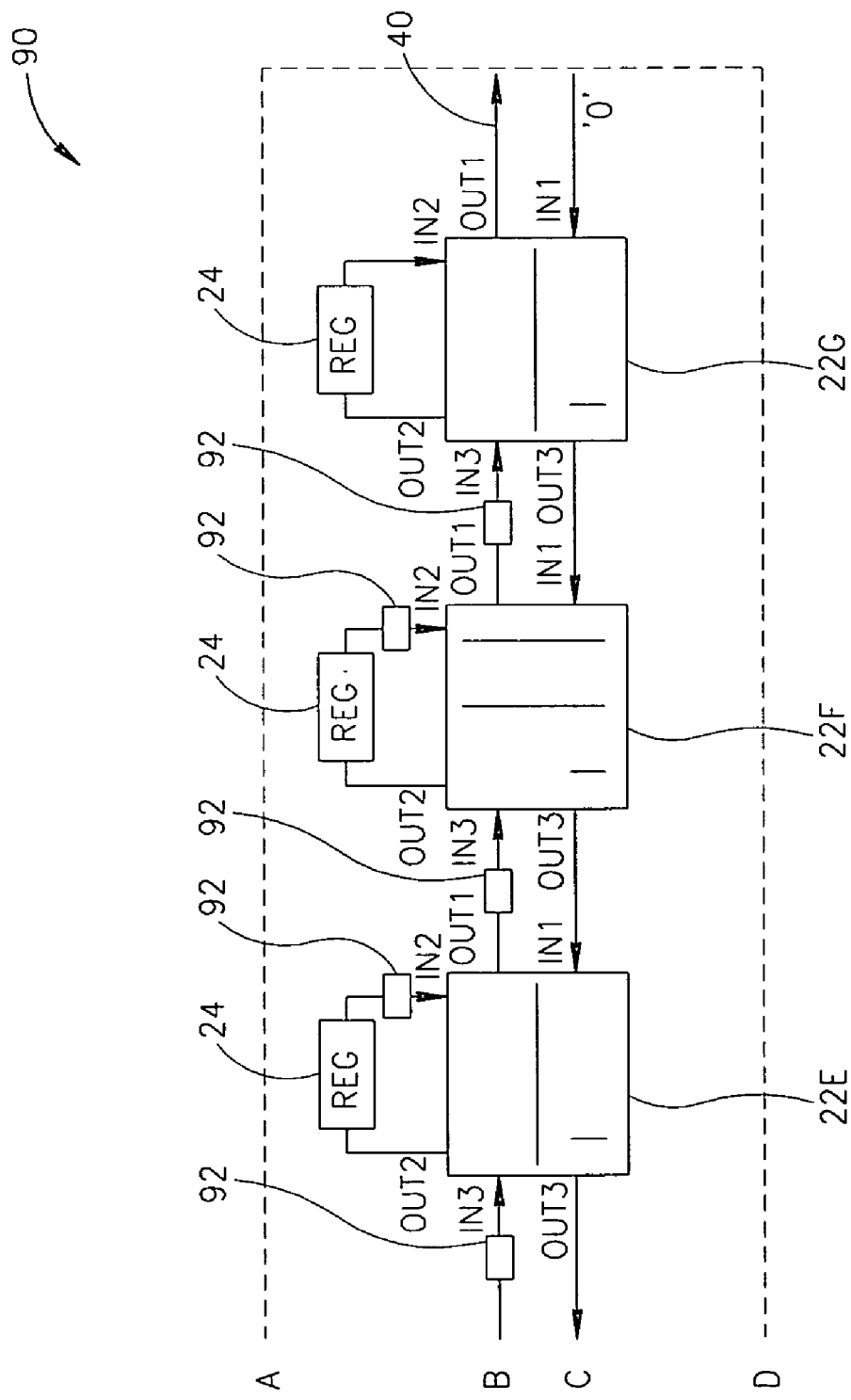

FIGS. 7A and 7B are a schematic block diagram of a wave digital filter 90, in accordance with a preferred embodiment of the present invention. Filter 90 is substantially of the structure of filter 20 (FIGS. 1A and 1B) using the adapters described in FIGS. 2A, 2B and 2C, with the addition of a plurality of latches 92 which are preferably situated on input lines of adapters 22. Latches 92 are preferably situated on those input lines which may receive non-valid values during the operation of filter 90 and/or on lines which may receive valid values before other inputs of the adapter are valid.

A control unit 98 preferably controls the opening of latches 92, to achieve a timing scheme similar to that described hereinabove. Preferably, control unit 98 receives a clock signal faster than the clock signal necessary for the clock cycle T1 of filter 20 in order to properly control the operation of latches 92. Lines connecting control unit 98 to latches 92 are omitted for clarity of the figure.

It is noted that FIGS. 7A and 7B are shown only by way of example, and a greater or lesser number of latches than shown may be used, depending on the circuitry or the function being performed. Furthermore, one or more of latches 92 may be replaced by uncontrolled delay elements in accordance with the principles described above with reference to FIGS. 5A, 5B, 5C and 6.

In some preferred embodiments of the present invention, for example, in those embodiments for which the chip die area of the WDF is important, other delay units are used instead of some or all of latches 70, 72 and/or 74. Such delay units may include various types of gates, and in some embodiments as described above, various types of uncontrolled delay elements. The gates may include various types of latches and strobes, which are controllably opened for propagation of signals. In a preferred embodiment of the invention, latches are implemented using D-flip flops, although any other types of memory units or registers may be used.

In the present application and claims, the term strobe gate refers to a logical gate (e.g., "and", "or", "nand", "nor") which performs a logical operation between a data signal and a control signal. For one value of the control signal, the output of the logical gate has a fixed value, while for another value of the control signal the output of the logical gate is equal to the data signal. For example, if the logical gate comprises an "and" gate, when it is desired to delay the data signal the control signal is set to '0', and therefore the output of the "and" gate is '0'. When it is desired that the data signal propagate, the control signal is set to '1' and hence the output of the "and" gate is equal to the data signal. It is noted that, in general, strobe gates require less chip die area than latches.

The opening of latches 70, 72 and/or 74 (or other controlled gates) may be performed responsive to control signals from a control unit or based on internal timing schemes related to the specific latch. In a preferred embodiment of the invention, one or more of latches 70, 72 and/or 74 open responsive to a predetermined number of changes in the values they hold.

It is noted that although the above preferred embodiments were illustrated on a specific WDF, the principles of the present invention are not limited to any specific WDF or to any specific adapters. Specifically, the principles of the invention may be implemented on WDFs with smaller or higher orders (i.e., less or more adapters), on WDFs with other topologies (e.g., ladder, lattice topologies), and on WDFs having adapters of various numbers of ports and of various types.

It will be appreciated that the above described methods may be varied in many ways, including, changing the order of steps, and the exact implementation used. It should also be appreciated that the above described description of methods and apparatus are to be interpreted as including apparatus for carrying out the methods and methods of using the apparatus.

The present invention has been described using non-limiting detailed descriptions of preferred embodiments thereof that are provided by way of example and are not intended to limit the scope of the invention. Variations of embodiments described will occur to persons of the art. Furthermore, the terms "comprise," "include," "have" and their conjugates, shall mean, when used in the claims, "including but not necessarily limited to." The scope of the invention is limited only by the following claims:

What is claimed is:

1. A wave digital filter, comprising:
   an adapter having at least first and second inputs and a controlled gate to disable the propagation into or within the adapter of a valid signal value received at the first input when a non-valid signal value is received at the second input.

2. A wave digital filter according to claim 1, wherein the controlled gate of the adapter comprises a latch.

3. A wave digital filter according to claim 1, wherein the controlled gate of the adapter comprises a strobe gate.

4. A wave digital filter according to claim 1, wherein the controlled gate comprises a delay unit.

5. A wave digital filter according to claim 1, comprising two or more adapters, wherein the controlled gate is able to delay the propagation of the valid signal value such that the valid signal value enters one of the two or more adapters substantially simultaneously with another valid signal value received by one of the two or more adapters.

6. A filter according to claim 1, wherein the value whose propagation is delayed for the predetermined time.

7. A wave digital filter according to claim 1, wherein the adapter comprises two or more ports, at least one port including one of said first and second inputs and an output.

8. A wave digital filter according to claim 1, wherein the adapter comprises a multiplier.

9. A wave digital filter according to claim 1, wherein the two or more adapters comprise two or more different types of adapters.

10. A method comprising:
    enabling an adapter of a wave digital filter to calculate new signal values based on signal values received at two or more inputs of the adapter only when valid signal values are received at all inputs of the adapter.

11. A method according to claim 10, comprising providing an input which carries a result from a different adapter.

12. A method according to claim 10, wherein enabling comprises enabling after a predetermined time.

13. A method according to claim 10, comprising disabling the adapter from calculating the new signal values until all the signal values required for performing the calculation are expected to be valid.

14. A method according to claim 10, wherein disabling comprises disabling an input of the adapter using a latch.

15. A method comprising:
    disabling propagation of a first valid signal value received at a first input of an adapter of a wave digital filter until a second valid signal value is received at a second input of the adapter; and
    enabling the adapter to calculate one or more new signal values based on the first and second valid signal values.

16. A method according to claim 15, wherein disabling comprises delaying propagation of the signal value received at the first input for a predetermined time.

17. A wave digital filter according to claim 15, wherein the controlled gate is able to delay the propagation of signal values from one adapter of the two or more adapters to another adapter of the two or more adapters until a predetermined number of changes occur in the signal values.

18. A wave digital filter, comprising:
    a controlled gate to control the propagation of a value generated by a first adapter to a second adapter based on the validity of the value.

19. An adapter of a wave digital filter, comprising:
    two or more inputs operably coupled to two or more functional units; and
    two or more enable lines operably coupled to the two or more functional units, respectively, wherein the two or more enable lines provide control signals to enable the operation of the two or more functional units, respectively, when valid signal values are received on the two or more inputs.

20. The adapter of claim 19, wherein the two or more inputs are operably coupled to the two or more functional units.

21. The adapter of claim 19, wherein the number of functional units is substantially equal to the number of the adapter inputs.

22. A wave digital filter comprising:
    a first adapter having at least three inputs and at least three outputs;
    a second adapter having at least three inputs and at least three outputs;
    a first controlled gate operably coupled to a first input of the first adapter;
    a first register operably coupled to a first output of the first adapter;
    a second controlled gate operably coupled to the first register and to a second input of the first adapter; and
    a third controlled gate operably coupled to a second output of the first adapter and to one of the inputs of the second adapter,
    wherein the first controlled gate, the second controlled gate and the third controlled gate are able to hold signal values and wherein the control unit is able to open the first controlled gate, the second controlled gate and the third controlled gate based on the valid signal values they hold.

* * * * *